United States Patent [19]

McTigue

[11] Patent Number: 5,367,251
[45] Date of Patent: Nov. 22, 1994

[54] TOOL FOR GRASPING AND PIERCING INSULATED ELECTRICAL CABLE FOR DETERMINING WHETHER CONDUCTOR OF CABLE IS ENERGIZED

[76] Inventor: James F. McTigue, 10 Brookhill Dr., W. Nyack, N.Y. 10994

[21] Appl. No.: 5,828

[22] Filed: Jan. 19, 1993

[51] Int. Cl.5 ................... G01R 19/145; H01R 4/24; H01R 13/621
[52] U.S. Cl. .................. 324/133; 324/72.5; 324/149; 439/391; 439/426; 439/480
[58] Field of Search ............. 324/725, 133, 149, 555, 324/556; 439/387, 389, 391, 394, 411, 412, 426, 431, 476, 477, 479, 480, 482

[56] References Cited

U.S. PATENT DOCUMENTS

| | | | |
|---|---|---|---|
| 634,862 | 10/1899 | Baggett | 324/556 |
| 2,237,187 | 4/1941 | Mantilla | 324/556 |
| 2,445,667 | 7/1948 | Fuglie | 324/555 |
| 3,363,171 | 1/1968 | Sietmann et al. | 324/72.5 X |
| 3,662,259 | 5/1972 | Dapilito | 324/555 |
| 3,923,363 | 12/1975 | Kraft | 439/477 X |
| 4,934,949 | 6/1990 | Charneski et al. | 439/387 |

*Primary Examiner*—Gerard R. Strecker
*Attorney, Agent, or Firm*—Brooks Haidt Haffner & Delahunty

[57] ABSTRACT

A tool for grasping an electrical power conductor has a plurality of pointed pins mounted on a movable platform to pierce cable sheathing and insulation and contact a conductor of a cable held clamped in place by the tool. The pins are arranged so that at least one pin will contact the conductor to determine whether the conductor is energized.

9 Claims, 3 Drawing Sheets

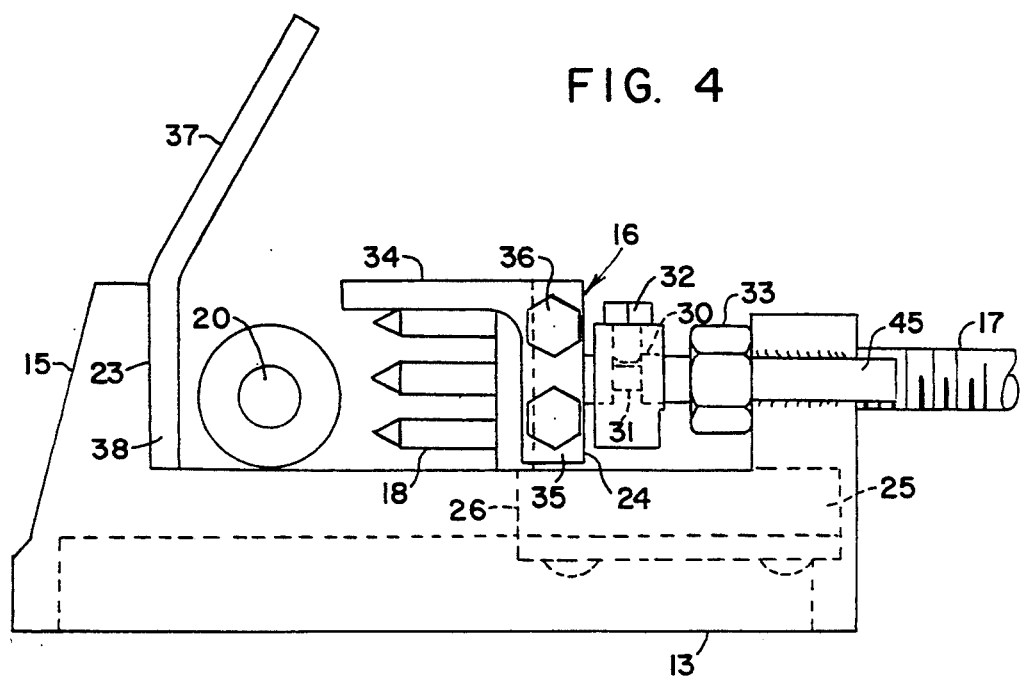
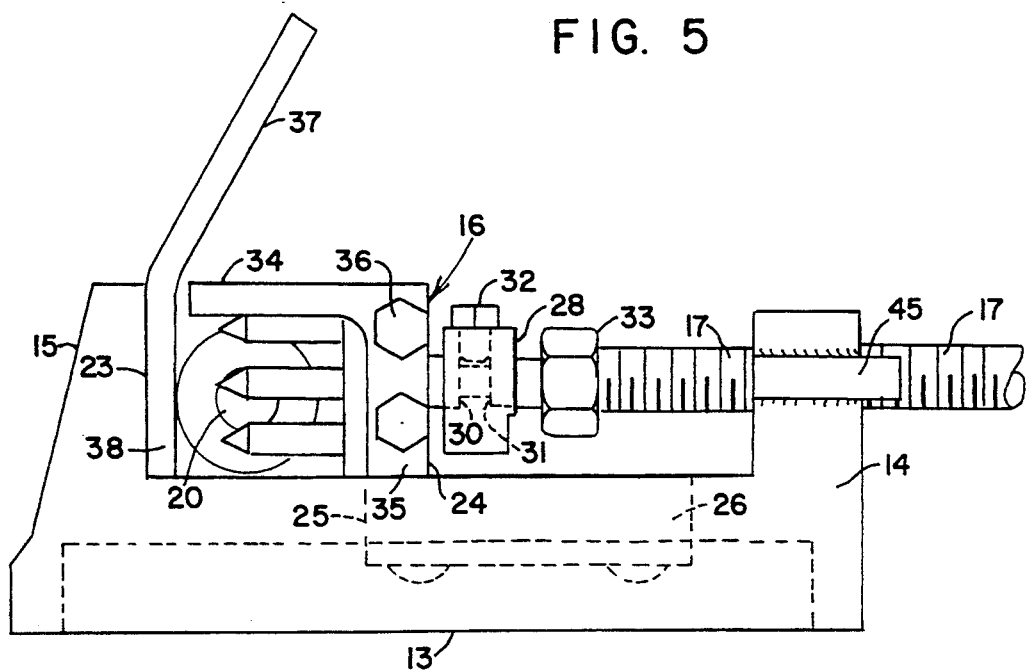

TOOL FOR GRASPING AND PIERCING INSULATED ELECTRICAL CABLE FOR DETERMINING WHETHER CONDUCTOR OF CABLE IS ENERGIZED

BACKGROUND OF THE INVENTION

1. Field of the Invention

The invention relates to the maintenance of electrical power distribution cables, and more particularly to a tool for gripping a cable such as a high voltage underground residential or commercial power cable and piercing the cable insulation for determining whether or not a conductor within the cable is energized.

2. Description of Related Art

There are commercially available spiked penetrator clamps that are used to verify that a cable is in a de-energized condition. A screw-threaded spike of the clamp has a conically pointed tip for piercing cable insulation to contact an internal conductor of the cable. Such a clamp can be mounted on the end of an elongated non-conducting stick to reach overhead or underground cables. The elongated non-conducting stick has a hook for fitting within an eye on an outer end of the clamp spike for rotation of the clamp spike. One supplier of such clamps and sticks is A. B. Chance Company of Centralia, Mo.

Known spiked penetrator clamps are not entirely satisfactory because such clamps permit misalignment with respect to a cable, in which case the tip of the advancing spike may pass by the conductor, not making any electrical contact with the conductor and giving a false indication that the cable is deenergized, with potentially hazardous results to workers or property.

SUMMARY OF THE INVENTION

The cable grasping and piercing tool of the present invention has means for positively gripping a cable to insure that at least one of a plurality of pointed pins will pierce the cable insulation and engage the conductor. A rotatable screw-threaded rod passes through an upper leg of a generally C-shaped clamp body for moving a platform mounted on an inner end of the rod towards and away from a lower leg of the C-shaped clamp body. The platform carries two or more pointed pins for piercing the insulation of a cable held in place between the lower clamp leg and a pair of guide arms which extend downward from opposite sides of the platform. The guide arms prevent misalignment of the tool with respect to the cable. The lower leg of the clamp body has an outwardly and upwardly extending lip for guiding the cable into place between the lower clamp leg and the platform. The tool may also be provided with means for attachment of a grounding cable.

A conventional elongated stick or handle of rigid non-conductive material can be used for turning of the threaded clamp rod by an operator working at a distance from an overhead or underground cable.

When, for example, a power outage shows that a power cable may have broken, maintenance personnel go to the site of the suggested break. If the cable is underground, a trench is dug to uncover a length of the cable, without touching the cable conductor, which may actually be energized. Then a worker moves the tool of the invention into place by sliding the upwardly extending lip of the tool's lower leg beneath the cable and bringing the cable into position beneath the movable pin-carrying platform. By rotating the threaded rod of the tool, the worker screws the platform downward until one or more of the pointed pins pierces the cable and contacts the internal conductor. If the conductor is "hot", i.e. energized, an electrical discharge will result when the conductor is contacted. The worker is protected by the insulation provided by the non-conductive stick. The tool may additionally be grounded through a ground wire attached to an existing structure such as a water main.

If the cable is found to be energized, the tool can be removed and used to grasp the cable at another location closer to the place where the power failure was detected, or the tool can be left in place and another like tool can be employed at the new downstream location. If the cable is found to be de-energized at the new location, the break in the conductor must then be between the places at which the tool was employed. Power can then be shut off and the faulty length of cable can be repaired or replaced.

In a similar manner, the tool of the invention can be used to check an overhead cable.

BRIEF DESCRIPTION OF THE DRAWINGS

In the several drawing figures, in which like reference characters designate like parts throughout:

FIG. 4 is a side view of the tool of the invention with hidden structure shown by dashed lines.

FIG. 5 is a view of the tool similar to that of FIG. 4 showing how the tool pierces cable insulation and contacts an inner conductor.

DETAILED DESCRIPTION OF PREFERRED EMBODIMENT

Figure 3:
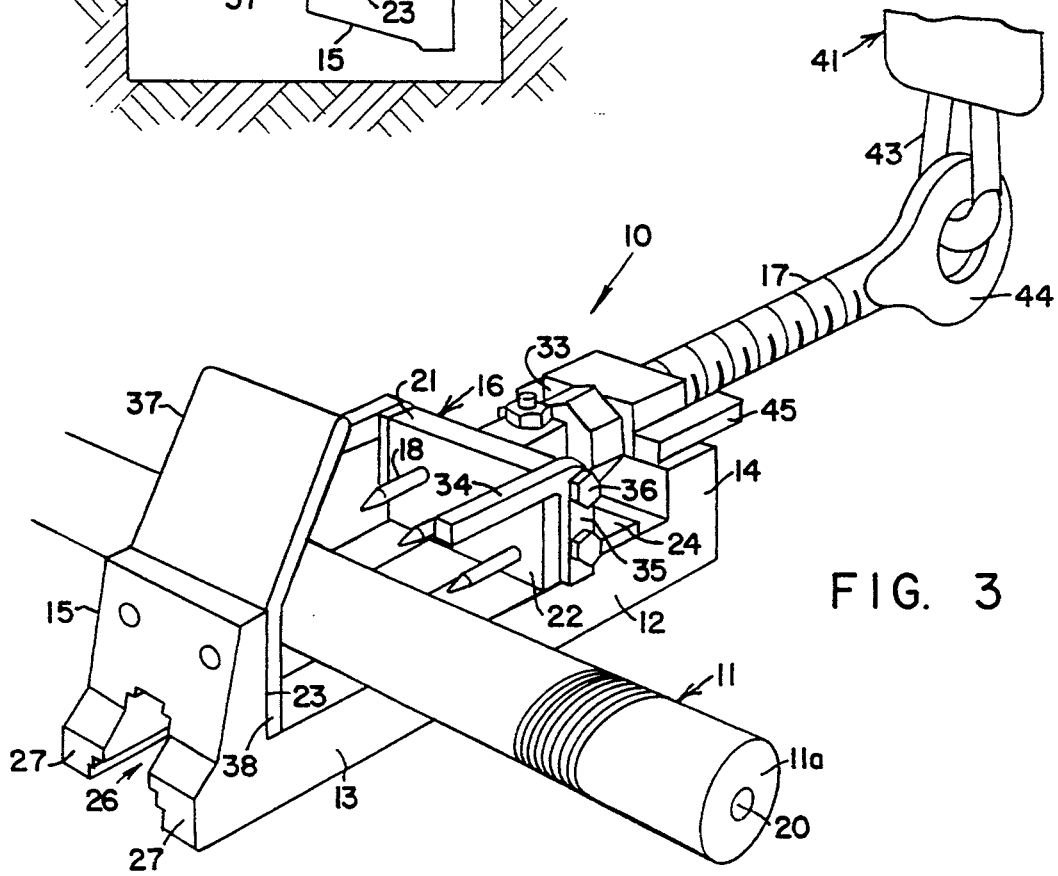
FIG. 3 is a view in perspective of the tool of the invention.

The perspective view of FIG. 3 shows the cable grasping and piercing tool of the invention, generally designated by the reference numeral 10, and illustrates how the tool 10 fits around a power cable, illustrated as a typical cable 11 having an internal conductor 20.

The tool 10 has a generally C-shaped clamp body 12 with an elongated middle portion 13 from which an upper clamp leg 14 and a lower clamp leg 15 extend parallel to each other and at right angles to the clamp middle portion 13. A platform 16, is movable toward and away from the lower clamp leg 15 by means of a screw threaded rod 17 which extends through a threaded bore in the upper clamp leg 14. In FIG. 3 the platform 16 is shown in its retracted position spaced away from the lower clamp leg 15. A plurality (three shown) of conically pointed pins 18 are mounted to extend from the lower side of the platform 16 for piercing the cable 11 when the platform 16 is moved toward the lower clamp leg 15 by rotation of the threaded rod 17.

Figure 1:
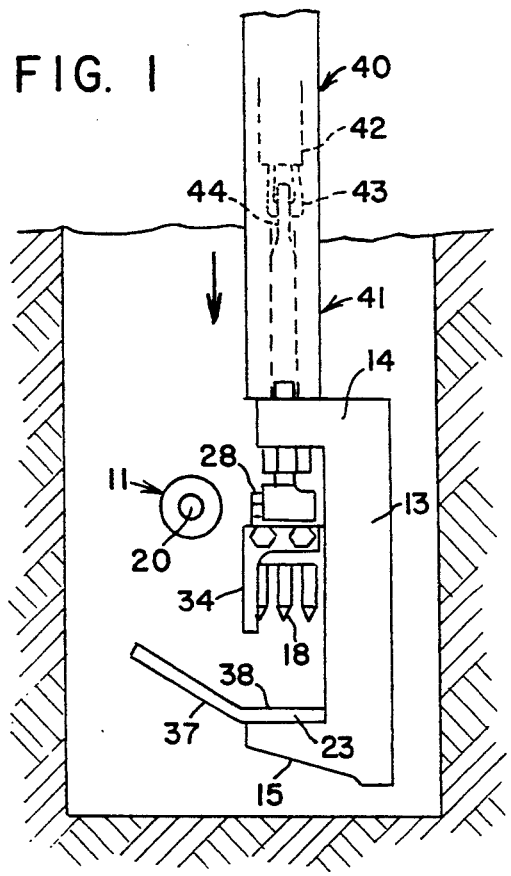
FIG. 1 is a side view of the tool of the invention in position before the tool is positioned for grasping an underground cable.
Figure 2:
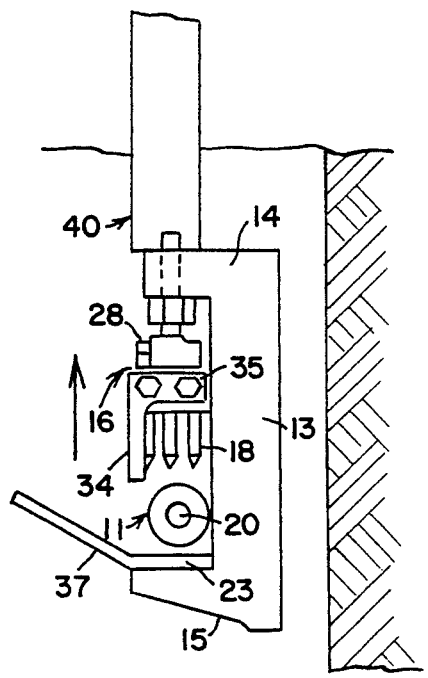
FIG. 2 is a view similar to that of FIG. 1 illustrating how the tool of the invention is positioned to grasp an underground cable.

The terms "upper" and "lower" are used for convenience throughout with reference to the tool 10 of the invention when the tool is positioned for grasping an underground cable, as, for example, shown in FIGS. 1 and 2. It will be understood that the tool 10 would be inverted to grasp an overhead cable, and could also be employed in a horizontal or other orientation as required by the location of the cable to be grasped.

The platform 16 comprises a generally rectangular flat plate 21 having a flat lower face 22 in parallel, spaced, opposed relationship with the flat upper surface 23 of the lower clamp leg 15. The pins 18 extend from the lower face 22 of the plate 21. Mounted atop the plate 21 is a guide member 24 which can be formed integrally with the plate 21 or secured thereto by screws or other suitable fasteners (not shown in the drawings).

The guide member 24 serves to restrict the motion of the plate 21 to linear up and down movement between the retracted position shown in FIG. 4 and the extended position illustrated in FIG. 5. That is, the plate 21 is not free to rotate along with the rotation of the threaded rod 17 but can only move toward and away from the lower clamp leg 15 as shown in the drawings.

The guide member 24 has a central slide portion 25 which extends rearwardly with respect to the plate 21. The slide portion 25 of the guide member 24 is shown in dashed lines in FIGS. 4 and 5 to constitute an extension of the part of the guide member 24 which overlies the flat plate 21 so that up or down movement of the flat plate 21 is guided by the constraint on the slide portion 25 of the guide member 24 which can only move linearly. The composite structure of guide member 24 and flat plate 21 moves as a unit. This slide portion 25 is slidingly received in a channel 26 that extends vertically between two spaced, opposed legs 27 of the clamp body 12. When the platform 16 is moved towards or away from the lower clamp leg 15, the slide portion 25 cooperates with the legs 27 in guiding the movement of the platform 16 as illustrated in FIGS. 4 and 5. The block-like upper portion 28 thus also moves as a unit with the flat plate 21 and slide portion 25 of the guide member 24 as shown in FIGS. 4 and 5. Upward or downward movement of the threaded rod 17 is communicated to the block-like upper portion 28 of the guide member 24, which receives the lower end 30 of the rod 17, and when the block-like upper portion 28 of the guide member 24 is moved by upward or downward movement of the lower end 30 of the threaded rod 17, the entire guide member 24 slides upward or downward, away from or toward the lower clamp leg 15, carrying the plate 21 along with the guide member 24. The guide member 24, comprising the upper block-like portion 28, slide portion 25 and the portion which overlies the flat plate 21 moves as a unit.

A block-like upper portion 28 of the guide member 24 receives the lower end of the rod 17 as shown in FIGS. 3, 4 and 5, whereby movement of the rod 17 serves to move the guide member 24, platform 16, and the pins 18 mounted on the platform, towards and away from the lower clamp leg 15 upon rotation of the rod 17. The block-like upper portion 28 has a vertically extending bore therethrough, into which the lower end 30 of the rod 17 extends.

As shown in FIGS. 4 and 5, the lower end 30 of the rod 17 is not threaded and has an annular groove 31 for sliding reception of the inner end of a screw 32 that passes through a bore in the block-like portion 28 of the guide member 24. When the rod 17 is rotated the screw 32 in the groove 31 causes the guide member 24 and hence the platform 16 to move vertically along with the rod 17. A stop nut 33 is shown on the threaded portion of the rod 17 to limit vertical movement, causing retraction of the platform 16 to be stopped at the position of FIG. 4 wherein the platform 16 is shown at its most retracted position. Stop means could, of course, also be provided to limit downward movement of the rod 17 and platform 16.

Figure 6:
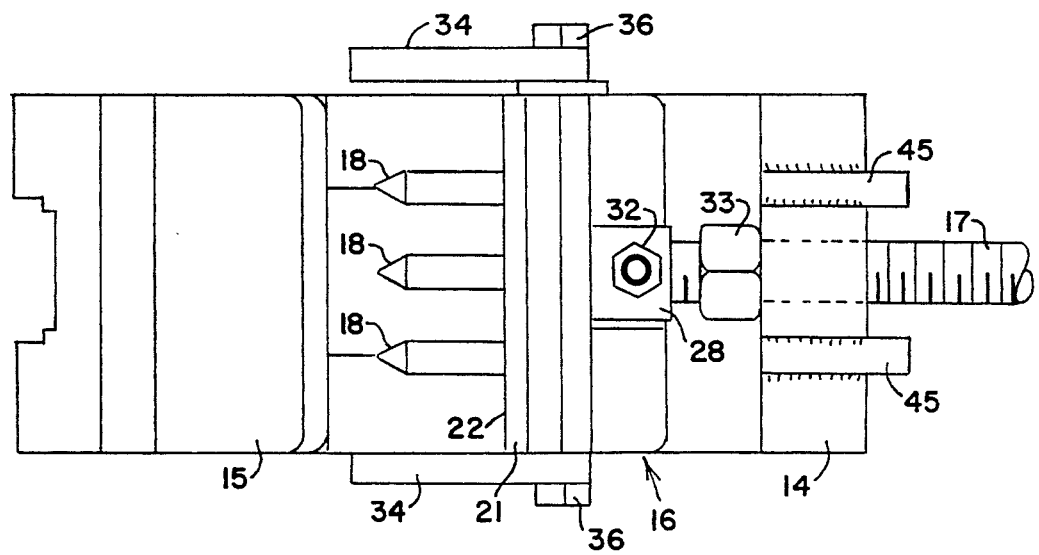
FIG. 6 is a front view of the tool of the invention in its "open" condition, with the platform withdrawn away from the lower clamp leg.

A pair of arms 34 extend downward from opposite sides of the platform 16 near the front of the platform 16. As shown in the drawings, the arms 34 extend towards the lower clamp leg 15, parallel to the pins 18, and preferably the arms 34 extend somewhat further downward than pins 18. As best seen in FIG. 6 the arms 34 are spaced apart by a distance somewhat greater than the width of the lower clamp leg 15, so that the ends of the arms 34 can pass on opposite sides of the lower clamp leg 15 when the platform 16 is at its lowermost range of travel. FIGS. 4 and 5 illustrate how the arms 34 serve to trap the cable 13 when the platform 16 is screwed down towards the cable 11. This entrapping of the cable 13 by the arms 34 prevents displacement of the tool 10 with respect to the cable, assuring the piercing of the cable by one or more of the pins 18.

In the embodiment shown in the drawings, each arm 34 has an upper portion 35 extending rearward at a right angle to the downwardly extending arm portion. The rearwardly extending upper portion 35 of each arm 35 is shown secured to a side face of the platform 16 by screws 36, but the arms 34 could alternatively be formed integrally with the platform 16.

Another feature of the tool 10 which aids in engaging and grasping a cable such as the cable 11 illustrated, is the outwardly and upwardly extending lip 37 that projects from the lower clamp leg 15. The leg 37 could be an integral extension of the lower jaw 15, but in the illustrated embodiment, the lip 37 has a horizontal rear portion 38 overlying the upper surface of the lower clamp leg 15 and secured to the jaw 15 by screws or the like. This rear portion 38 of the lip 37 provides a flat upper surface upon which the cable 11 rests when the cable is pinned in the position shown in FIG. 5 and pierced by one or more of the pins 18. The illustrations of FIG. 1 and FIG. 2 show how the lip 37 functions in catching a cable 11 and guiding the cable into place beneath the platform 16. The lip 37 can slant upwardly at an angle of about 45 degrees with respect to the horizontal. If desired, the lip 37 could have a curved surface for guiding a cable into the space beneath the platform 16.

An elongated rod or stick 40 of non-conductive material such as glass fiber reinforced plastic can be employed for manipulating the tool 10. The lower end portion 41 of such a stick 40 is shown in FIGS. 1-3. Sticks such as the stick 40 are commercially available, so the stick 40 will not be described in detail.

The lower end 41 of the stick 40 is hollow, and houses a rod 42 terminating in a hook 43 for engaging an eye 44 on the outer end of the screw-threaded rod 17 as best seen in FIGS. 1 and 3. Rotation of the rod 42 serves to rotate the hook 43 and to screw the rod 17 upwards or downwards for opening or closing the space between the platform 16 and the lower clamp leg 15. FIG. 1 shows the hook 43 and eye 44 in retracted position within the lower end 41 of the stick 40. FIG. 3 illustrates the interconnection of the hook 43 and eye 44 in detail.

For engagement with the end of the rod 40, the upper leg 14 of the clamp body 12 preferably has a pair of spaced, upstanding ears 45 as shown, for example, in FIGS. 3 and 6. The ears 45 extend above the upper clamp leg 14 to engage the lower end 41 of the stick 40 and prevent relative rotation of the stick 40 and the tool 10.

Figure 7:
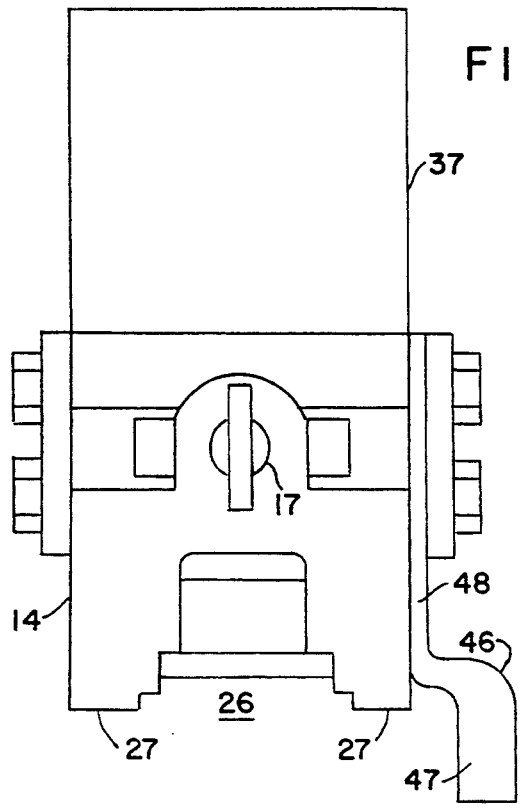
FIG. 7 is a top view of the tool of the invention.
Figure 8:
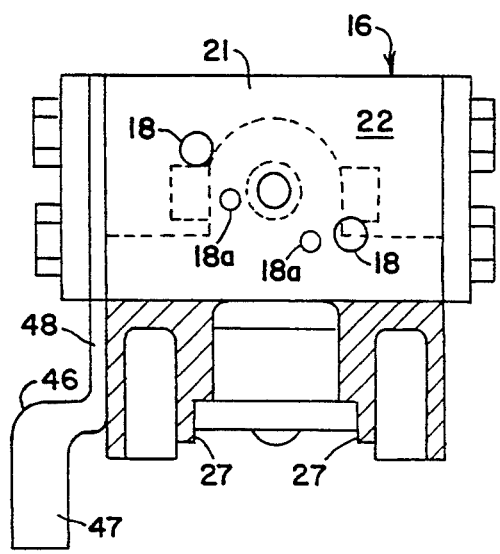
FIG. 8 is a cross-sectional view of the tool of the invention looking upward from below the platform and illustrating a preferred arrangement of the insulation-piercing pins.

The views from above and below of FIG. 7 and 8 show how a fitting 46 for the attachment of an optional grounding wire can be provided for the tool 10. The fitting 46 has a tubular portion 47 for receiving the end of a ground wire (not shown) and a flattened portion 48 shown secured to a side of the platform 16 by means of screws. A wire attached to the tool 10 by means of the fitting 46 can be electrically connected to an existing structure such as a cold water pipe for grounding the tool 10.

A typical electrical power distribution cable for residential or commercial service can have an outside diameter of about one inch or less, with an internal conductor covered by a layer of insulating material and also, in some cases, a protective sheath of woven metal bands or the like. In order to determine whether the conductor of such a cable is energized the insulation layer and any outer protective sheath such as the grounding sheath 11a shown in FIG. 3 must be opened or pierced to reach the internal conductor.

The tool 10 is used to grasp a power cable such as the cable 11 and to determine whether a conductor 20 of the cable is energized by causing one or more of the pointed pins 18 to pierce the cable insulation and make electrical contact with the conductor 20. In order to assure that the conductor 20 is contacted, the tool 10 has not one pointed spike like tools of the prior art, but a plurality of pointed pins 18. The use of at least two such pins 18, in cooperation with the cable-trapping arms 34, assures that at least one pin 18 will contact the cable conductor 20.

The drawings, and particularly FIGS. 3 and 8, show a preferred arrangement of three pointed pins 18. As shown the pins 18 are positioned along a diagonal line across the lower face 22 of the flat plate 21 of the platform 16. The pointed ends of adjacent pins 18 are spaced apart by a distance, in the transverse direction of the conductor 50, which is smaller than the diameter of the conductor 20, so the conductor cannot pass untouched between two adjacent pins 18. As seen in FIGS. 1 and 2, the outermost pins 18 are too close to the arms 34 or the body 13 of the tool 10 for the conductor to escape contact with at least one of the pins 18. Other arrangements and spacings of two or more pins like the pins 18 will suggest themselves. Holes 18a are indicated in FIG. 8 to show where pins 18 could be placed for use of the tool with a smaller diameter cable. What is important is that the pins and arms 34 are so spaced that at least one pin will contact the conductor when the platform 16 is lowered and the cable insulation is pierced.

The pins 18 are preferably removably attached to the plate 21, for example, by threads at the pin ends remote from their pointed ends. This permits easy replacement of a dull, broken or bent pin 18.

The pins 18 and other parts of the tool 10 can be made of steel, aluminum or other electrically conductive material. Preferably the pins 18 and screw threaded rod 17 are made of steel for hardness and durability, whereas more massive parts of the tool 10 can be made of aluminum for light weight.

Various modifications and applications of the tool according to the invention will suggest themselves to those acquainted with electrical power distribution, and such modifications and applications are considered to be within the spirit and scope of the invention.

What is claimed is:

1. A tool for grasping and piercing insulated electrical power cable to determine whether or not a conductor of the cable is energized, comprising:
   a clamp body having a fixed lower clamp leg and a fixed upper clamp leg spaced and separated from said lower clamp leg by a distance sufficient for the reception of a cable between said legs, a platform mounted for vertical movement between said upper and lower clamp legs, said lower clamp leg having a flat upper surface for supporting a cable during piercing and said platform having a flat lower face in parallel, spaced opposed relationship to said flat upper surface of the lower clamp leg, said platform being mounted on screw means extending through said upper clamp leg for moving the platform, at least two pointed pins carried by the platform, said pins being spaced apart in a direction transverse to the conductor by a distance smaller than the diameter of the conductor of a cable to be pierced, and a pair of arms mounted on and extending downward from opposite sides of the platform for movement therewith to trap a cable between the platform and the flat upper surface of the lower clamp leg.

2. The tool of claim 1 and including an outwardly and upwardly projecting lip on said lower clamp leg for guiding a cable into position beneath the platform.

3. The tool of claim 1 wherein said screw means comprises a threaded rod passing through a threaded vertical bore in the upper clamp leg.

4. The tool of claim 3 wherein eye means for grasping and turning the rod is provided on an outer end of the rod.

5. The tool of claim 1 and including means on said clamp body for guiding the platform towards and away from the lower clamp leg.

6. The tool of claim 1 wherein the platform comprises a flat, rectangular plate and the pins are removably affixed to the plate.

7. The tool of claim 1 and including means for attachment of an electrical ground wire to the platform.

8. A tool for grasping and piercing the insulation of an insulated electrical power cable to determine whether a conductor of the cable is energized, comprising a clamp body, a screw threaded rod extending through an upper leg of said clamp body and a platform mounted on a block with a bore therethrough at an end of the threaded rod for movement upon rotation of said screw threaded rod, a lower clamp leg extending beneath the platform, said lower clamp leg having a flat upper surface for supporting a cable, a plurality of pointed pins mounted on and extending downward from a flat lower surface of the platform for piercing a cable supported on said flat upper surface of the lower clamp leg, said pins being spaced apart in a direction transverse to the conductor by a distance that is smaller than the diameter of the conductor, and arms extending downward from opposite sides of the platform for trapping the cable between the platform and the flat upper surface of the lower clamp leg.

9. The tool of claim 8 and including an upwardly and outwardly extending lip mounted on the lower clamp leg for guiding a cable into place beneath the pins.

* * * * *